US012726183B2

(12) United States Patent
Tsai et al.

(10) Patent No.: US 12,726,183 B2
(45) Date of Patent: Sep. 1, 2026

(54) SYSTEM AND METHOD FOR SYNCHRONIZING AN OSCILLATOR OUTPUT SIGNAL WITH REFERENCE INPUT SIGNAL

(71) Applicant: Taiwan Semiconductor Manufacturing Company, Ltd., Hsinchu (TW)

(72) Inventors: Tsung-Hsien Tsai, Hsinchu (TW); Ya-Tin Chang, Hsinchu (TW); Chih-Hsien Chang, Hsinchu (TW); Cheng-Hsiang Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/958,105

(22) Filed: Nov. 25, 2024

(65) Prior Publication Data

US 2026/0149435 A1 May 28, 2026

(51) Int. Cl.
*H03K 3/36* (2006.01)
*H03K 5/00* (2006.01)

(52) U.S. Cl.
CPC ........... *H03K 3/36* (2013.01); *H03K 5/00006* (2013.01)

(58) Field of Classification Search
CPC ............................ H03K 3/36; H03K 5/00006
USPC ............................................................ 331/8
See application file for complete search history.

(56) References Cited

U.S. PATENT DOCUMENTS 7,095,260 B2 8/2006 Miyata et al.
2004/0081053 A1* 4/2004 Kojima ................ G11B 7/0062
2007/0001771 A1* 1/2007 Hori ....................... H03K 5/133 331/57
2010/0026406 A1* 2/2010 Fujiwara ............... H03L 7/0995 331/36 R
2018/0152192 A1* 5/2018 Tsai ...................... H03L 7/0991
2019/0319581 A1* 10/2019 Chen ......................... H03F 1/32
2019/0372578 A1 12/2019 Chen et al.
2020/0089299 A1* 3/2020 Kim ...................... H03L 7/0997
2022/0360270 A1* 11/2022 Jung ....................... H03L 7/093

FOREIGN PATENT DOCUMENTS

TW I279988 B 4/2007

OTHER PUBLICATIONS

Taiwan Office Action; Application No. 114102045; Dated Nov. 5, 2025.

* cited by examiner

*Primary Examiner* — Richard Tan
(74) *Attorney, Agent, or Firm* — Jones Day

(57) ABSTRACT

A system comprises an oscillator circuit that includes first and second tuning banks and a current-controlled oscillator. The first tuning bank is connected to a voltage node and receives the tuning signal, generates a voltage drop at the voltage node that corresponds to the tuning signal, and allows the flow of a first current therethrough that varies with the voltage drop. The second tuning bank is connected to the voltage node and receives an oscillator input signal and regulates a second current that flows therethrough in response to a voltage difference between the voltage drop and the oscillator input signal. The current-controlled oscillator receives a third current that is a sum of the first and second currents and fine-tunes an oscillator output signal based on the third current to track a frequency of a reference input signal.

20 Claims, 6 Drawing Sheets

SYSTEM AND METHOD FOR SYNCHRONIZING AN OSCILLATOR OUTPUT SIGNAL WITH REFERENCE INPUT SIGNAL

BACKGROUND

A phase-locked loop (PLL) synchronizes the frequency/phase of an oscillator output signal with that of a reference input signal. For example, a PLL may include a phase detector that detects a phase difference between the reference input signal and the oscillator output signal and generates an error signal proportional to the phase difference. That error signal may then be filtered to generate an oscillator input signal that adjusts the phase of the oscillator output signal. The adjusted oscillator output signal may be fed back to the phase detector, forming a closed loop that continuously adjusts the oscillator output signal until its phase is aligned with the reference signal's phase. In certain implementations, precise control of timing throughout the PLL can be important to proper system functionality.

BRIEF DESCRIPTION OF THE DRAWINGS

Aspects of the present disclosure are best understood from the following detailed description when read with the accompanying figures.

DETAILED DESCRIPTION

Figure 1:
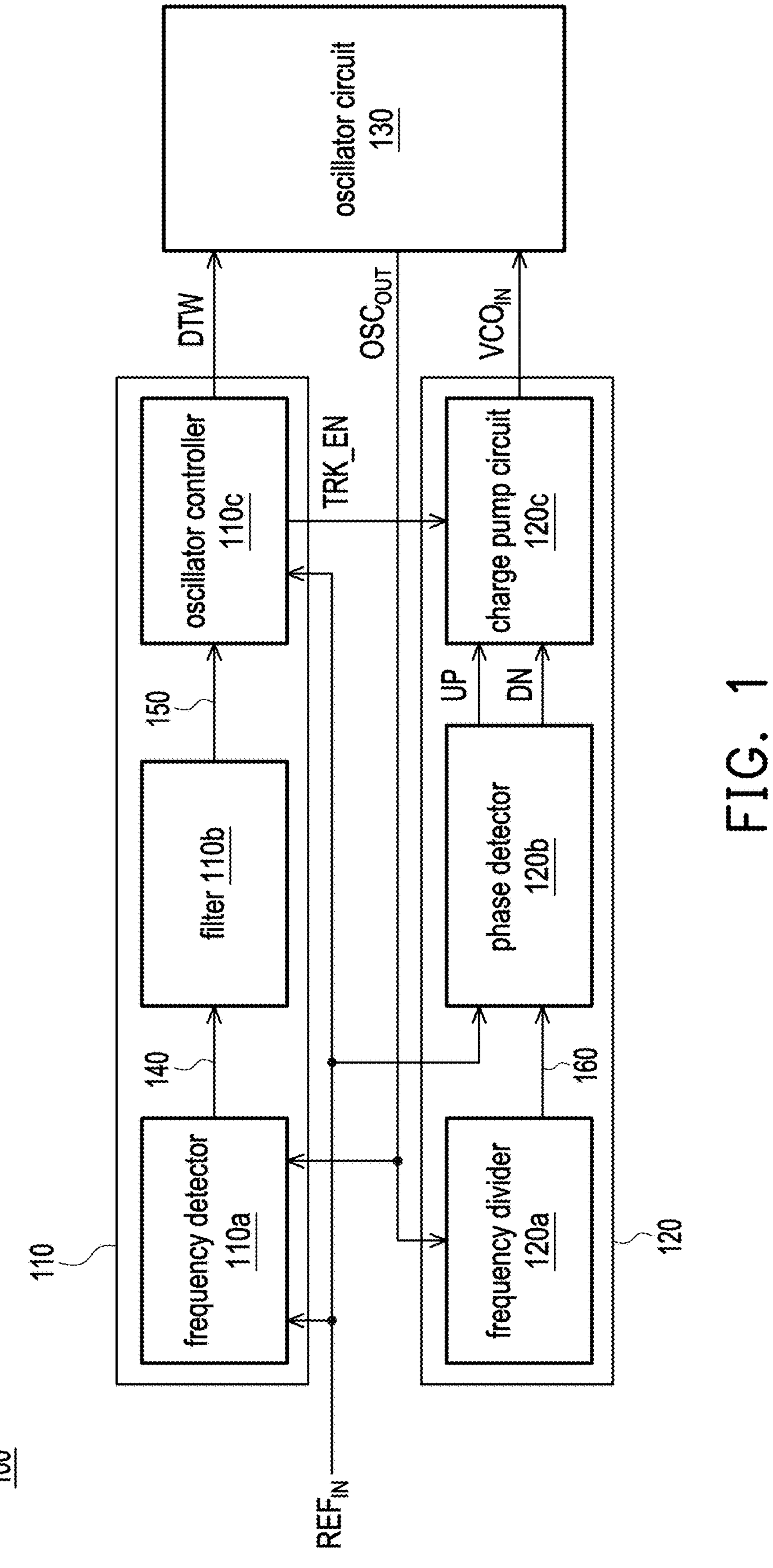
FIG. 1 is a block diagram of an exemplary system in accordance with embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Systems and methods herein can provide precise control of PLL timing to provide high-quality system operation. In example embodiments, the system (e.g., a phase-locked loop or PLL, such as a hybrid PLL) synchronizes the frequency/phase of an oscillator output signal with that of a reference input signal. The system includes an oscillator circuit that fine-tunes the oscillator output signal in response to a tuning signal so that its frequency tracks the reference signal's frequency. The oscillator circuit generates a constant current to facilitate its fine-tuning process, which may require a large oscillator input signal (e.g., greater than 400 mV). This can result in a narrow tuning range (e.g., less than 4 GHz) and a higher supply voltage, e.g., 0.9 V or greater, for the system.

To address these fine-tuning issues, the systems and methods as described in certain examples herein employ a device, e.g., a tuning bank, which generates a voltage drop and allow the flow of a current that varies with the voltage drop. In one example, the tuning bank includes one or more resistors selectively connected to oscillator circuit. As will be described further below, in examples, this approach can achieve a relatively wide tuning range (e.g., covering 4 GHz) and a relatively low supply voltage (VDD), e.g., 0.6 V or less.

FIG. 1 is a block diagram of an exemplary system 100 in accordance with embodiments of the present disclosure. In this exemplary embodiment, the system 100 (e.g., a PLL, such as a hybrid PLL) operates in both a frequency tracking mode and a phase tracking mode. In some embodiments, during the frequency tracking mode, the system 100 fine-tunes an oscillator output signal ($OSC_{OUT}$) so that its frequency tracks (i.e., is equal, substantially equal to, or a multiple of) the frequency of a reference input signal ($REF_{IN}$). During the phase tracking mode, the system 100 aligns or substantially aligns a phase of an oscillator output signal ($OSC_{OUT}$) with the phase of the reference input signal ($REF_{IN}$). In further detail, as illustrated in FIG. 1, the system 100 includes a digital control loop 110, an analog control loop 120, and an oscillator circuit 130. The digital control circuit 110, during the frequency tracking mode, receives the reference input signal ($REF_{IN}$) and the oscillator output signal ($OSC_{OUT}$) and generates a tuning signal, e.g., a digital tuning word (DTW), based on a frequency difference between the reference input signal ($REF_{IN}$) and the oscillator output signal ($OSC_{OUT}$). The tuning signal (DTW) fine-tunes the oscillator output signal ($OSC_{OUT}$) so that its frequency tracks the frequency of the reference input signal ($REF_{IN}$). For example, the digital control loop 110 includes a frequency detector 110*a*, a filter 110*b*, and an oscillator controller 110*c*.

The frequency detector 110*a* receives the reference input signal ($REF_{IN}$) and the oscillator output signal ($OSC_{OUT}$), detects a frequency difference therebetween, and generates an error signal 140 proportional to the frequency difference detected thereby. When the error signal 140 is zero or substantially zero, it indicates that the frequency of the oscillator output signal ($OSC_{OUT}$) is locked to the frequency of the reference input signal ($REF_{IN}$). Otherwise, it indicates that a frequency mismatch between the reference input signal ($REF_{IN}$) and the oscillator output signal ($OSC_{OUT}$). This suggests that the frequency of the oscillator output signal ($OSC_{OUT}$) is either higher or lower than and not a multiple of the frequency of the reference input signal ($REF_{IN}$). In certain embodiments, the frequency detector 110*a* converts the reference input signal ($REF_{IN}$) and the oscillator output signal ($OSC_{OUT}$), which are analog signals, into digital signals before performing the detection.

The filter 110*b* (e.g., a loop filter, such a digital loop filter) receives the error signal 140, removes its high-frequency components, and generates samples of direct current (DC) components or near DC components of the error signal 140 as a filtered error signal 150.

The oscillator controller 110*c* receives the filtered error signal 150 and the reference input signal ($REF_{IN}$) and generates a tuning signal, e.g., a digital tuning word (DTW). In one example, the tuning signal (DTW) is generated by multiplying the filtered error signal 150 by a normalization value (e.g., the frequency of the reference input signal $REF_{IN}$ divided by the gain of the oscillator circuit 130). Such a multiplication compensates for PVT effects (e.g., variations in semiconductor fabrication, supply voltage fluctuations, and temperature changes) and other factors (such as component aging and tolerance), enhancing accuracy of the tuning signal (DTW). As will be described hereinafter, the tuning signal (DTW) is used to fine-tune the oscillator output signal ($OSC_{OUT}$) so its frequency tracks the frequency of the reference input signal ($REF_{IN}$).

The oscillator controller 110*c* also monitors the filtered error signal 150. Based on the monitoring result, the oscillator controller 110*c* generates a tracking enable signal (TRK_EN) that enables and disables operation of the system 100 in the phase tracking mode. For example, if the monitoring result indicates that the filtered error signal 150 is either greater or lower than zero, the oscillator controller 110*c* disables the analog control loop by setting the tracking enable signal (TRK_EN) to a low (or high) logical level. Conversely, the oscillator controller 110*c* enables the analog control loop 120 by setting the tracking enable signal (TRK_EN) to a high (or low) logical level if the monitoring result indicates that the filtered error signal 150 is zero or substantially zero, allowing the system 100 to enter the phase tracking mode.

The analog control loop 120, during the phase tracking mode, receives the reference input signal ($REF_{IN}$) and the oscillator output signal ($OSC_{OUT}$) and generates an oscillator input signal ($VCO_{IN}$) that corresponds to a phase difference between the reference input signal ($REF_{IN}$) and the oscillator output signal ($OSC_{OUT}$). The oscillator input signal ($VCO_{IN}$) aligns or substantially aligns the phase of the oscillator output signal ($OSC_{OUT}$) with the phase of the reference input signal ($REF_{IN}$). For example, the analog control loop 120 includes a feedback divider 120*a*, a phase detector 120*b*, and a charge pump circuit 120*c*.

The feedback divider 120*a* (e.g., a synchronous high-speed divider) receives the oscillator output signal ($OSC_{OUT}$), divides its frequency by a predetermined factor, and generates a feedback signal 160 having a lower frequency than the oscillator output signal ($OSC_{OUT}$). It is noted that despite the frequency division, the feedback signal 160 remains synchronized or substantially synchronized with the oscillator output signal ($OSC_{OUT}$), e.g., the rising or falling edge of the feedback signal 160 is aligned with those of the oscillator output signal ($OSC_{OUT}$).

The phase detector 120*b* receives the feedback signal 160 and the reference input signal ($REF_{IN}$) and detects the phase difference between the feedback signal 160 and the reference input signal ($REF_{IN}$). Based on the detection result, the phase detector 120*b* generates UP and DN signals. The UP signal indicates that the phase of the oscillator output signal ($OSC_{OUT}$) is lagging behind the phase of the reference input signal ($REF_{IN}$) and needs to be advanced. Conversely, the DN signal indicates that the phase of the oscillator output signal ($OSC_{OUT}$) is leading the phase of the reference input signal ($REF_{IN}$) and needs to be delayed.

The charge pump circuit 120*c* receives the UP and DN signals and includes a charge pump that converts these voltage signals into a current signal and a loop filter, e.g., a low-pass filter, that removes high-frequency components from the current signal, converting it into a smooth voltage signal, which serves as the oscillator input signal ($VCO_{IN}$). During the frequency tracking mode (i.e., when the analog control loop 120 is disabled), the oscillator input signal ($VCO_{IN}$) is set to a predetermined level, e.g., half of the supply voltage (VDD/2). During the phase tracking mode, the tuning signal (DTW) is frozen (i.e., held at its last value when the frequency of the oscillator output signal $OSC_{OUT}$ is locked to the frequency of the reference input signal $REF_{IN}$) and the oscillator input signal ($VCO_{IN}$) is then used to align the phase of the oscillator output signal ($OSC_{OUT}$) with the phase of the reference input signal ($REF_{IN}$).

The oscillator circuit 130, e.g., a voltage-controlled oscillator (VCO) circuit, such as a ring oscillator, during the frequency tracking mode, receives a tuning signal (DTW) and, in response to the tuning signal (DTW), fine-tunes the frequency of the oscillator output signal ($OSC_{OUT}$) to track the frequency of the reference input signal ($REF_{IN}$). During the phase tracking mode, the oscillator circuit 130 receives the oscillator input signal ($VCO_{IN}$) and, in response to the oscillator input signal ($VCO_{IN}$), aligns the phase of the oscillator output signal ($OSC_{OUT}$) with the phase of the reference input signal ($REF_{IN}$). As will be described hereinafter, the oscillator circuit 130 employs a device, e.g., a tuning bank, that generates a voltage drop across thereof and allows the flow of a current therethrough that varies with the voltage drop. In one example, the tuning includes one or more resistors selectively connected to oscillator circuit. This approach enables the system 100 to achieve a relatively wide tuning range, e.g., such as up to 4 GHz, while operating at a relatively low supply voltage (VDD), e.g., 0.6 V or less.

Figure 2:
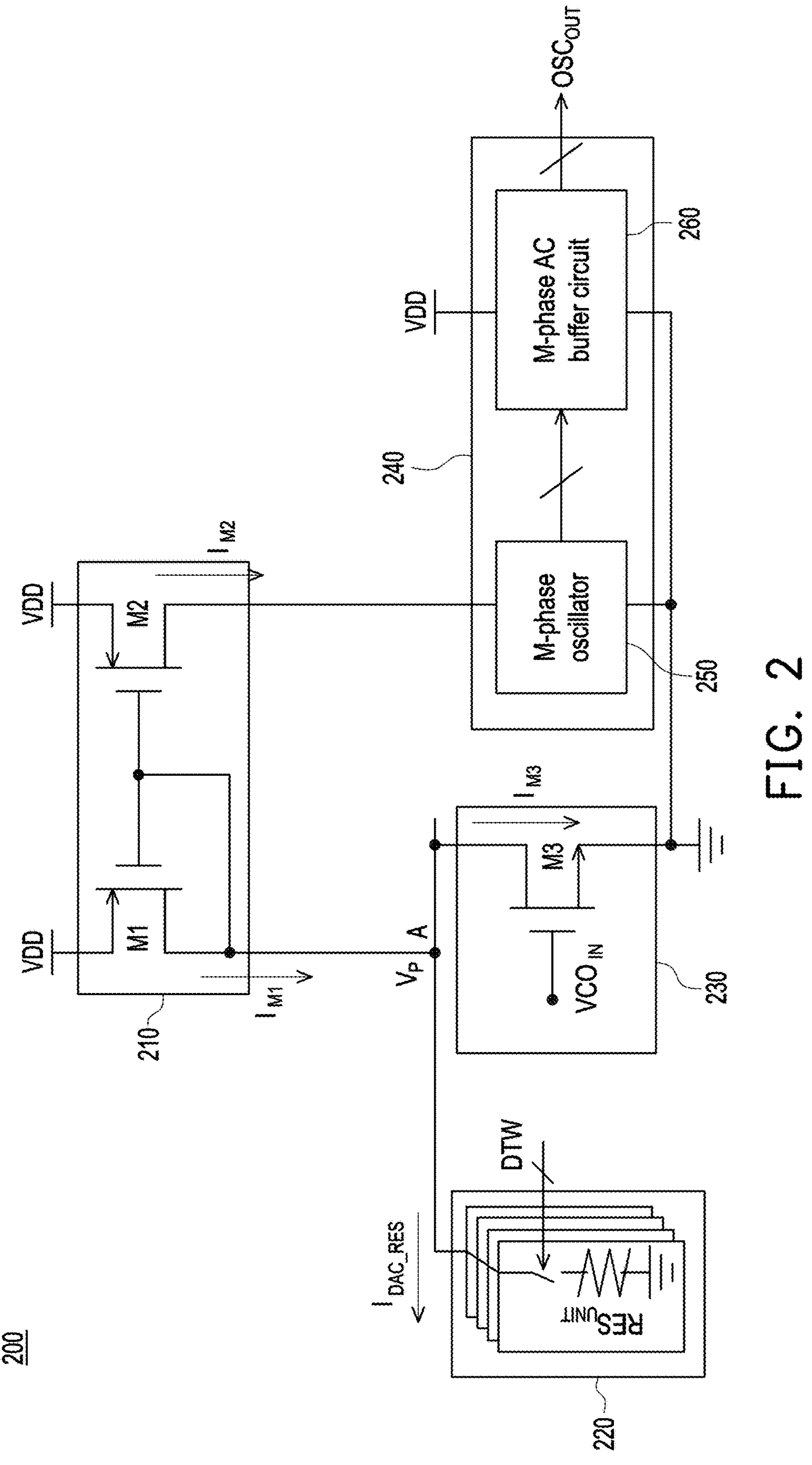
FIG. 2 is a circuit/block diagram illustrating an exemplary oscillator circuit in accordance with various embodiments of the present disclosure.

Example supporting circuitry for an oscillator circuit 200, e.g., oscillator circuit 130, is depicted in FIG. 2. It is understood that these circuitry are provided by way of example, not by limitation, and other suitable circuitry are within the scope of the present disclosure. FIG. 2 is a circuit/block diagram illustrating an exemplary oscillator circuit 200 in accordance with various embodiments of the present disclosure. As illustrated in FIG. 2, the example oscillator circuit 200 includes a current mirror 210, a first tuning bank 220, a second tuning bank 230, and a current-controlled oscillator 240. The current mirror 210 includes a master transistor (M1) that is configured with a master current ($I_{M1}$) flowing therethrough and a slave transistor (M2) that generates a slave current ($I_{M2}$) that mirrors (i.e., a duplicate or multiple) of the master current ($I_{M1}$). For example, the gate terminal and the source/drain terminal of the master transistor (M1) and the gate terminal of the slave transistor (M2) are connected to each other and to a voltage node (A).

The first tuning bank 220, e.g., a digital tuning bank, fine-tunes the oscillator output signal ($OSC_{OUT}$) so that its frequency tracks the frequency of the reference input signal ($REF_{IN}$). For example, the first tuning bank 220 is connected between the voltage node (A) and, in response to a tuning signal (DTW), generates a voltage drop ($V_P$) across thereof and allows the flow of a current ($I_{DAC\_RES}$) therethrough that varies with the voltage drop ($V_P$). In some embodiments, the first tuning bank 220 includes a plurality of resistors and a plurality of switches, each of which selectively connects a respective one of the resistors to the voltage node (A) in based on the tuning signal (DTW). Consequently, the current ($I_{DAC\_RES}$) can be expressed by Equation 1:

$$I_{DAC\_RES} = (Vp / RES_{UNIT}) \times DTW \quad (1)$$

where Vp is the voltage drop at the voltage node (A), $RES_{UNIT}$ is the resistance value of the resistors connected in parallel to the voltage node (A), and DTW is the value of the tuning signal (DTW).

In certain embodiments, the tuning signal (DTW) is in the form of a binary code, e.g., a 5-bit binary code including values ranging from 0 to 31. This range provides 32 discrete tuning steps, enabling fine-tuning of the frequency of the oscillator output signal ($OSC_{OUT}$). In such certain embodiments, the number of resistors of the first tuning bank 220 corresponds to the number of steps in a frequency tuning range. In some embodiments, the frequency tuning range can be divided into 32 steps, each represented by a distinct 5-bits binary code of the tuning signal (DTW). This configuration allows frequency tuning range, e.g., 2.4 GHz, to be divided into 32 steps, with each step having a size of 75 MHz.

Various configurations for the first tuning bank 220 are contemplated in other embodiments, so long as they achieve the intended purpose described herein for the first tuning bank 220.

The second tuning bank 230, e.g., an analog tuning bank, facilitates alignment of the phase of the oscillator output signal ($OSC_{OUT}$) with the phase of the reference input signal ($REF_{IN}$). For example, the second tuning bank 230 is connected to voltage node (A) and, in response to a voltage difference between the oscillator input signal ($VCO_{IN}$) and the voltage drop ($V_P$), regulates the flow of a current ($I_{M3}$) therethrough. In some embodiments, the second tuning bank 230 includes a transistor (M3) having a first source/drain terminal that is connected to the voltage node (A), a second source/drain terminal connected to electrical ground (or a reference voltage VSS), and a gate terminal that receives the oscillator input signal ($VCO_{IN}$). Various configurations for the second tuning bank 230 are contemplated in other embodiments, so long as they achieve the intended purpose described herein for the second tuning bank 230.

The current-controlled oscillator 240 generates one or more oscillator input signals ($VCO_{IN}$). In some embodiments, the current-controlled oscillator 240 includes a multi-phase oscillator 250 and a multi-phase alternating current (AC) buffer circuit 260. The multi-phase oscillator 250, e.g., a 4-phase oscillator, generates four oscillator output signals ($OSC_{OUT}$), each phase-shifted by a predetermined phase angle, e.g., 90° (i.e., 360°/4), in response to the slave current ($I_{M2}$). The slave current ($I_{M2}$) mirrors the master current ($I_{M1}$) and is a sum of the currents ($I_{DAC\_RES}$, $I_{M3}$). The multi-phase AC buffer circuit 260 maintains or improves the integrity of the oscillator output signals ($OSC_{OUT}$) by amplifying them, providing isolation, reducing noise, and minimizing delays. In other embodiments, the multi-phase oscillator 250 and the multi-phase AC buffer circuit 260 may have any suitable number of phases.

Figure 3:
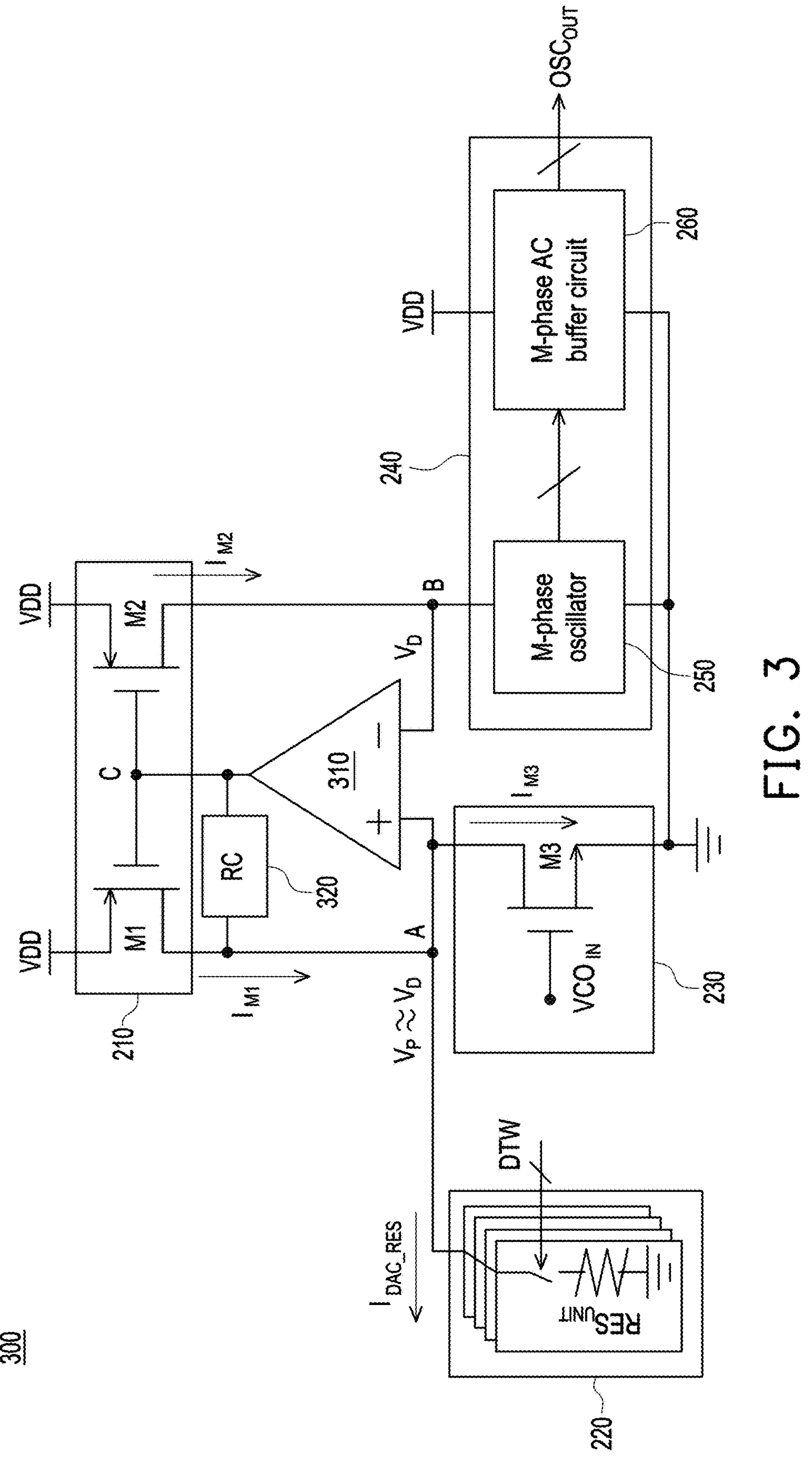
FIG. 3 is a circuit/block diagram illustrating another exemplary oscillator circuit in accordance with various embodiments of the present disclosure.

FIG. 3 is a circuit/block diagram illustrating another exemplary oscillator circuit 300 in accordance with various embodiments of the present disclosure. As illustrated in FIG. 3, the example oscillator circuit 300, e.g., oscillator circuit 130, differs from the oscillator circuit 200 in that the oscillator circuit 300 further includes an operational amplifier 310 and a resistor-capacitor (RC) filter 320. The operational amplifier 310 ensures that the slave current ($I_{M2}$) precisely mirrors the master current ($I_{M1}$). For example, the operational amplifier 310 has a non-inverting input connected to a first voltage node (A) between the master transistor (M1) and the analog/digital tuning bank 220, 230, an inverting input connected to a second voltage node (B) between the slave transistor (M2) and the current-controlled oscillator 240, and an output connected to a voltage node (C) between the gate terminal of the master transistor (M1) and the gate terminal of the slave transistor (M2). The operational amplifier 310 compares a voltage drop (Vp) at the non-inverting input thereof with the voltage drop ($V_D$) at the inverting thereof and adjusts its output to make them substantially equal. This arrangement forces the master and slave transistors (M1, M2) to have substantially the same gate-source voltage, resulting in the slave current ($I_{M2}$) precisely mirroring the master current ($I_{M1}$).

The RC filter 320 is connected between the voltage nodes (A, C) and acts as a low-pass filter, allowing low-frequency components, e.g., steady DC reference voltage, to pass, while attenuating high-frequency noise. This filtering ensures that the voltage drop ($V_P$) fed back to the operation amplifier 310 remains stable that may otherwise degrade the performance of the current mirror 210, resulting in a more accurate slave current ($I_{M2}$).

Figure 4:
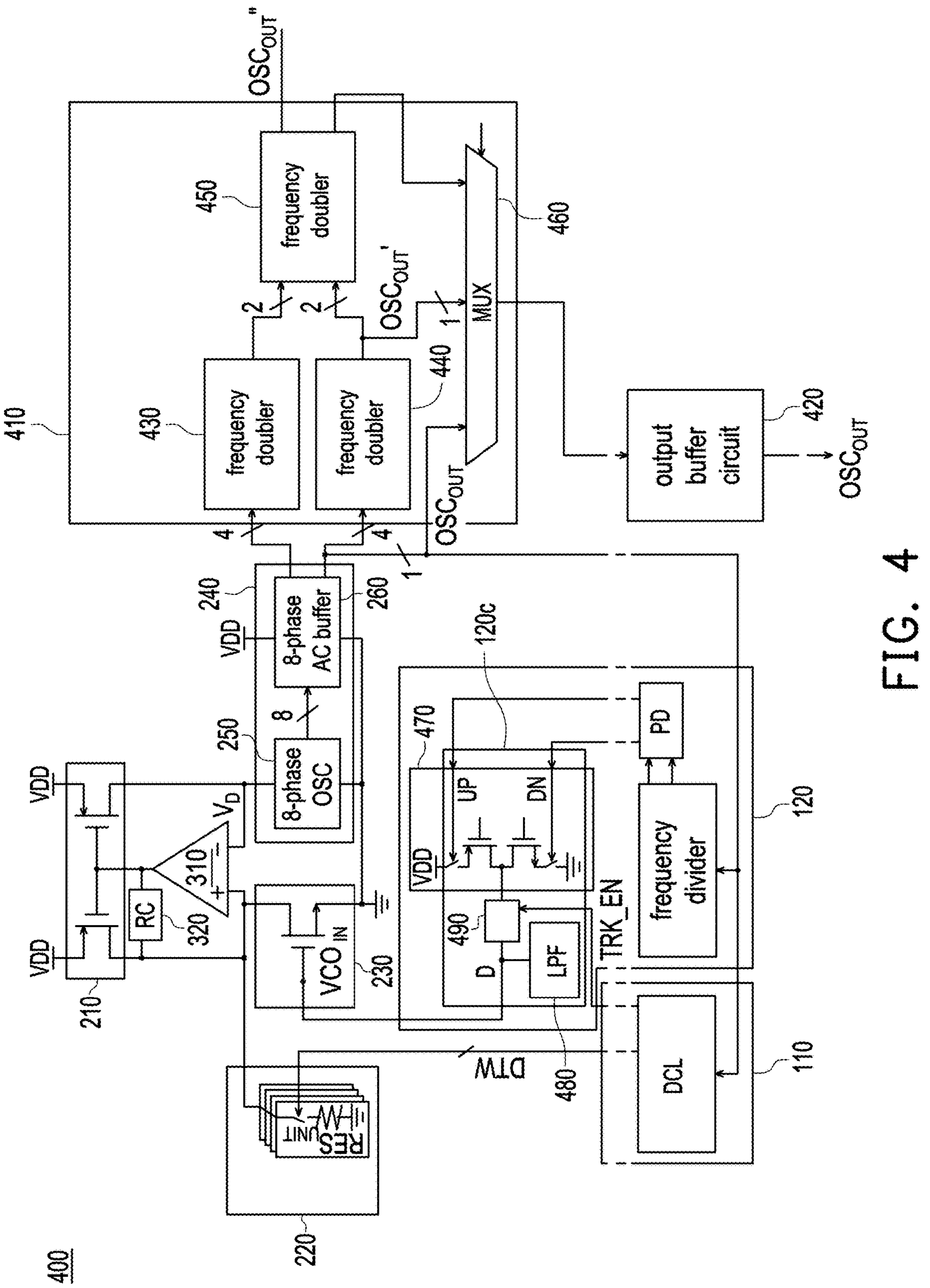
FIG. 4 is a circuit/block diagram illustrating another exemplary oscillator circuit in accordance with various embodiments of the present disclosure.

FIG. 4 is a circuit/block diagram illustrating another exemplary oscillator circuit 400 in accordance with various embodiments of the present disclosure. As illustrated in FIG. 4, the example oscillator circuit 400, e.g., oscillator circuit 130, differs from the oscillator circuit 300 in that the oscillator circuit 400 further includes a frequency multiplier 410 and an output buffer circuit 420. In this exemplary embodiment, the current-controlled oscillator 240 includes an 8-phase oscillator 250 and an 8-phase AC buffer circuit 260. The 8-phase oscillator 250 generates eight oscillator output signals ($OSC_{OUT}$), each phase-shifted by 45° (i.e., 360°/8). The 8-phase AC buffer circuit 260 receives the oscillator output signals ($OSC_{OUT}$) and splits them into two paths, each carrying four oscillator output signals ($OSC_{OUT}$).

The frequency multiplier 410 generates an output signal having a frequency that is a multiple of its input signal frequency. For example, the frequency multiplier 410 is connected between the current-controlled oscillator 240 and the output buffer circuit 420 and includes a plurality of frequency doublers 430-450 and a multiplexer 460. The frequency doubler 430, e.g., a pseudo frequency doubler, receives the four oscillator output signals ($OSC_{OUT}$) from one of the paths and generates two oscillator output signals ($OSC_{OUT}$'), each having a frequency a multiple of, e.g., substantially twice, the frequency of the oscillator output signal ($OSC_{OUT}$). The frequency doubler 440, e.g., a pseudo frequency doubler, receives the four oscillator output signals ($OSC_{OUT}$) from the other of the paths and generates two oscillator output signals ($OSC_{OUT}$'), each having a frequency a multiple of, e.g., substantially twice, the frequency of the oscillator output signal ($OSC_{OUT}$). The frequency doubler 450, e.g., a pseudo frequency doubler, receives the four oscillator output signals ($OSC_{OUT}$') and generates two oscillator output ($OSC_{OUT}$"), each having a frequency a multiple of, e.g., substantially twice, the frequency of the oscillator output signal ($OSC_{OUT}$').

The multiplexer 460, in response to a select signal, selectively connects one of the current-controlled oscillator 240, the frequency doubler 440, and the frequency doubler 450 to the output buffer circuit 420. The output buffer circuit 420 maintains or improves the integrity of the oscillator output signal ($OSC_{OUT}$, $OSC_{OUT}$', $OSC_{OUT}$") by amplifying it, providing isolation, reducing noise, and minimizing delays and outputs the amplified selected oscillator output signal ($OSC_{OUT}$). In an alternative embodiment, the output buffer circuit 420 includes a frequency divider that generates an output signal having a frequency that is a fraction of its input signal frequency. For example, in such an alternative embodiment, the output buffer circuit 420 may output an oscillator output signal ($OSC_{OUT}$) having a frequency half of the oscillator output signal ($OSC_{OUT}$, $OSC_{OUT}'$, $OSC_{OUT}''$) frequency.

The charge pump circuit 120*c* includes a charge pump 470 and a low-pass filter 480. The charge pump 470 receives the UP and DN signals and convert these voltage signals into a current signal. For example, the charge pump 470 includes first and second transistors and first and second switches. The first and second transistors are connected in series. The first switch selectively connects the first transistor to the supply voltage (VDD) in response to the UP voltage signal. The second switch selectively connects the second transistor to electrical ground (or a reference voltage VSS) in response to the DN voltage signal. The loop filter 480 is connected to a voltage node (D) between the charge pump 470 and the tuning bank 230 and removes high-frequency components from the current signal, generating a smooth oscillator input signal ($VCO_{IN}$).

The charge pump circuit 102*c* further includes a gate circuit 490 that is connected to between the voltage node (D) and the charge pump 470 and that, in response to the track enable signal (TRK_EN), selectively enables the tuning bank 230 to receive the oscillator input signal ($VCO_{IN}$) from the charge pump 470. For example, the voltage node (D) is connected to electrical ground (or reference voltage Vss) through a first resistor. During the frequency tracking mode, the gate circuit 490 connects the voltage node (D) to the supply voltage (VDD) through a second resistor. At this time, the oscillator input signal ($VCO_{IN}$) is set to, e.g., half of the supply voltage or VDD/2. During the phase tracking mode, the gate circuit 490 disconnects the voltage node (D) from the supply voltage (VDD). At this time, the tuning bank 230 receives the oscillator input signal ($VCO_{IN}$) from the charge pump 470.

Figure 5:
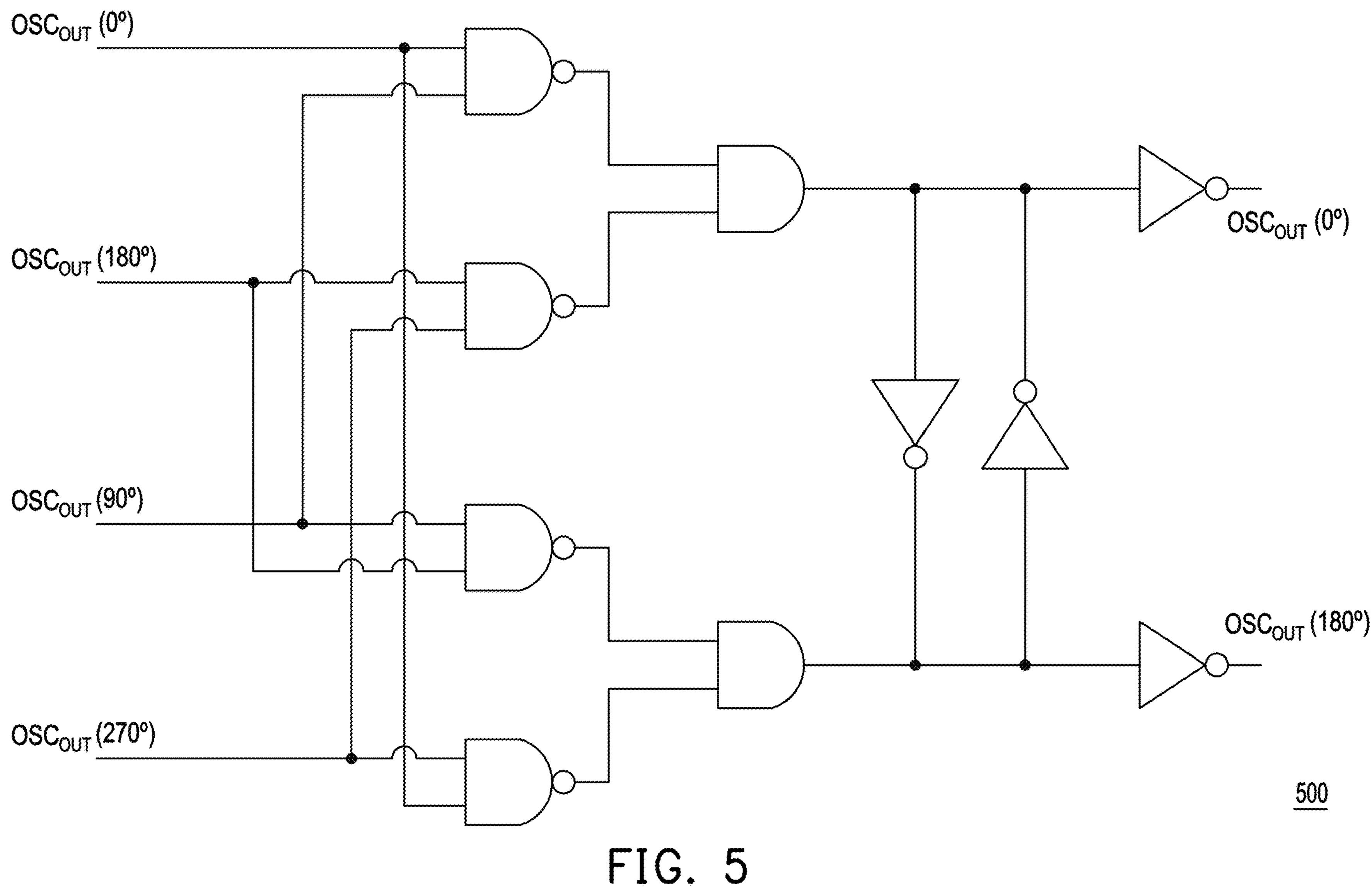
FIG. 5 is a circuit illustrating an exemplary frequency doubler in accordance with various embodiments of the present disclosure.

FIG. 5 is a circuit illustrating an exemplary frequency doubler 500 in accordance with various embodiments of the present disclosure. As illustrated in FIG. 5, the example frequency doubler 500, e.g., frequency doubler 430, includes two pairs of NAND gates, a pair of AND gates, a pair of inverters, and a latch. Each NAND gate receives an oscillator output signal ($OSC_{OUT}$) having a distinct phase 0°, 90°, 180°, 270°. Each AND gate receives two of the oscillator output signals ($OSC_{OUT}$). The latch is connected between the output of one of the AND gate and the output of the other of the AND gates. Each inverter is connected to the output of the respective AND gate. Various configurations for the frequency doublers 500 are contemplated in other embodiments, so long as they achieve the intended purpose described herein for the frequency doublers 500.

From experimental results, the slow-slow (SS) and fast-fast (FF) corners of a system, e.g., system 100, when the oscillator output signal is at 4 GHz, are illustrated in TABLE I, in accordance with various embodiments of the present disclosure. The SS corner simulates the worst-case performance in terms of speed, where the system 100 is expected to operate more slowly. Conversely, the FF corner simulates the best-case performance, where the system 100 operates faster than average.

TABLE I

| $OSC_{OUT}$ Signal = 4 GHz | | |
|---|---|---|
| $I_{RO}$ | SS | MAX |
| | FF | MIN |
| $V_D$ | SS | MAX |
| | FF | MIN |
| $I_{DAC\_RES}$ | SS | MAX |
| | FF | MIN |
| $F_{STEP}$ | SS | 91 MHz |
| | FF | 83 MHz |
| $VCO_{IN}$ Range | <100 mV (suitable for 0.6 V application) | |

As shown, the SS/FF corner of the current signal ($I_{DAC\_RES}$) is consistent with those of the oscillator circuit 130 current ($I_{RO}$) and the voltage drop ($V_D$). Specifically, when the oscillator circuit 130 current ($I_{RO}$) and the voltage drop ($V_D$) reach their maximum values at the SS corner, the current ($I_{DAC\_RES}$) also reaches its maximum value at the SS corner, unlike in conventional systems where it reaches its minimum. Similarly, when the oscillator circuit 130 current ($I_{RO}$) and the voltage drop ($V_D$) reach their minimum values at the FF corner, the current signal ($I_{DAC\_RES}$) also reaches its minimum value at the FF corner, unlike in conventional systems where it reaches its maximum value.

This consistency allows the oscillator input signal ($VCO_{IN}$) to stay below 100 mV, permitting the system 100 to operate at a relatively low supply voltage (VDD), e.g., 0.6 V or less. As a result, the variation of the frequency step ($F_{STEP}$) is significantly reduced, e.g., from 3.5× to 0.09×. For example, the frequency step ($F_{STEP}$) decreases from 125 MHz (e.g., ranging from 50 MHz at the SS corner to 175 MHz at the FF corner) to 8 MHz (e.g., ranging from 91 MHz at the SS corner to 83 MHz at the FF corner). The frequency step ($F_{STEP}$) is the change increment in the frequency of the oscillator output signal ($OSC_{OUT}$), representing how much the frequency shifts between discrete operating points.

Figure 6:
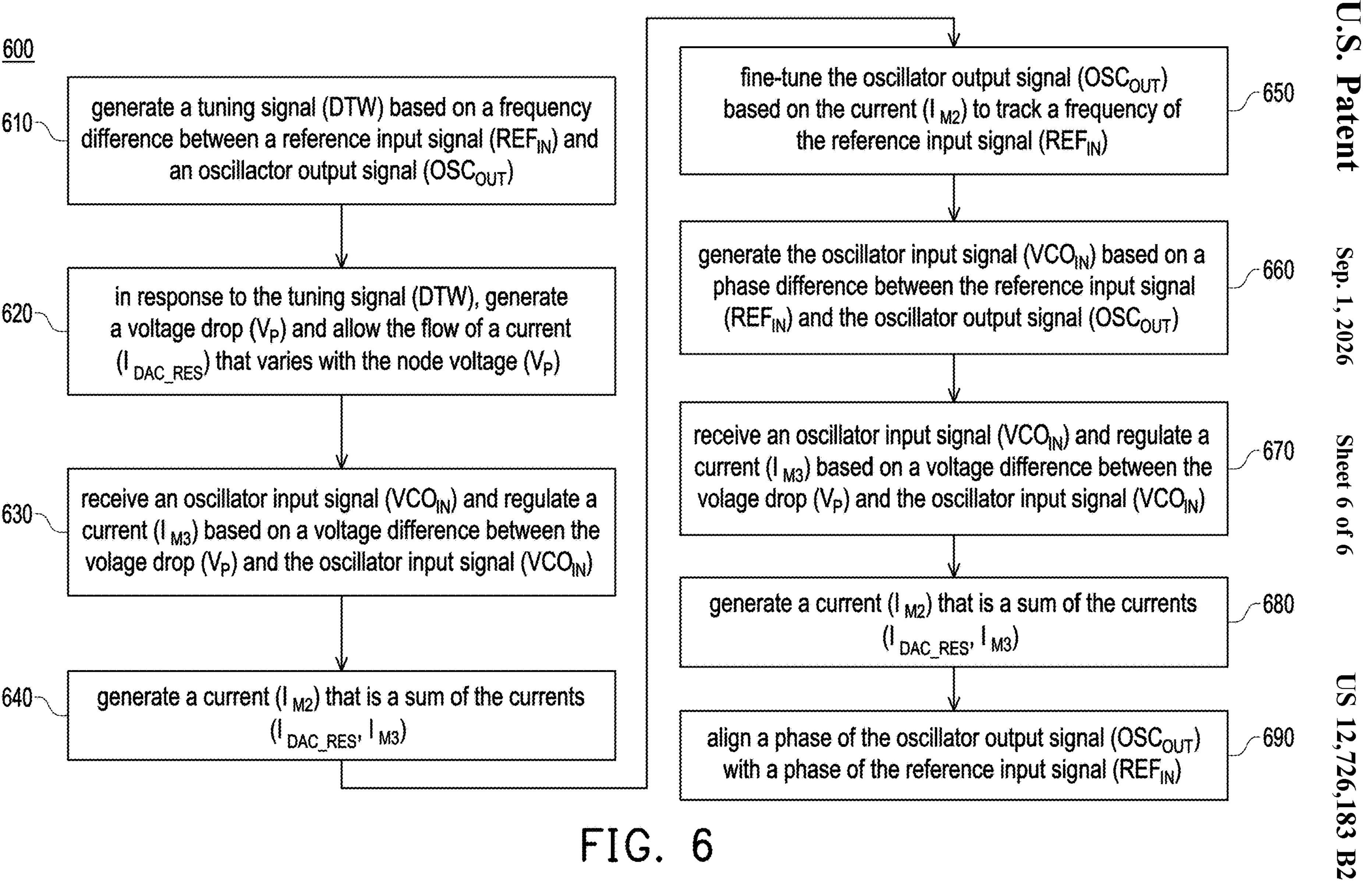
FIG. 6 is a flowchart of an exemplary method of synchronizing an oscillator output signal with a reference input signal in accordance with embodiments of the present disclosure.

FIG. 6 is a flowchart of an exemplary method 600 of synchronizing an oscillator output signal ($OSC_{OUT}$) with a reference input signal ($REF_{IN}$) in accordance with embodiments of the present disclosure. The example method 600 is described with further reference to FIGS. 1-5 for ease of understanding. It is understood that the method 600 is applicable to structures other than those of FIGS. 1-5. Further, it is understood that additional operations can be provided before, during, and after the method 600, and some of the operations described below can be replaced or eliminated, in an alternative embodiment of the method 600.

In operation 610, the system 100 operates in a frequency tracking mode. For example, operation 610 includes: the first control loop 110 disables alignment of phase of the oscillator output signal ($OSC_{OUT}$) with the phase of the reference input signal ($REF_{IN}$) by the second control loop 120; the first control loop 110 receives the reference input signal ($REF_{IN}$) and the oscillator output signal ($OSC_{OUT}$), detects a frequency difference between them, and generates an error signal 140 proportional to the frequency difference detected thereby; the digital control loop 110 filters error signal, removing unwanted noise from the error signal 140; the digital control loop generates a tuning signal (DTW) based on the reference input signal ($REF_{IN}$) and the filtered error signal 150.

In operation 620, the oscillator circuit 130 generates a voltage drop ($V_P$) and allows the flow of a current ($I_{DAC\_RES}$) that varies with the voltage drop ($V_P$). At this time, the second control loop 120 generates an oscillator input signal ($VCO_{IN}$) having a predetermined value, e.g., half of the supply voltage (VDD). In operation 630, the oscillator circuit 130 regulates a current ($I_{M3}$) based on a voltage difference between the oscillator input signal ($VCO_{IN}$) and the voltage drop ($V_P$). In operation 640, the oscillator circuit 130 generates a current ($I_{M2}$) that is a sum of the currents ($I_{DAC\_RES}$, $I_{M3}$). In operation 650, the oscillator circuit 130 fine-tunes the oscillator output signal ($OSC_{OUT}$) based on the current ($I_{M2}$) to track the frequency of the reference input signal ($REF_{IN}$).

Subsequently, the digital control loop 110 locks the frequency of the oscillator output signal ($OSC_{OUT}$) to the frequency of the reference input signal ($REF_{IN}$) and enables the analog control loop 120. The system 100 then operates in the phase tracking mode. At this time, in operation 660, the second control loop 120 generates the oscillator input signal ($VCO_{IN}$) that corresponds to a phase difference between the reference input signal ($REF_{IN}$) and the oscillator output signal ($OSC_{OUT}$). For example, operation 660 includes: the second control loop 120 divides the frequency of the oscillator output signal ($OSC_{OUT}$) by a predetermined factor and generates a feedback signal 160 that has a slower frequency than the oscillator output signal ($OSC_{OUT}$); the second control loop 120 receives the reference input signal ($REF_{IN}$) and the feedback signal 160 and detects a frequency difference therebetween; the second control loop 120 generates an UP signal, which indicates that the phase of the oscillator output signal ($OSC_{OUT}$) is lagging the phase of the of the reference input signal ($REF_{IN}$), and a DN signal, which indicates that the phase of the oscillator output signal ($OSC_{OUT}$) is leading the phase of the reference input signal ($REF_{IN}$); the digital control loop 110 receives the UP and DN signals and control the voltage level of the oscillator input signal ($VCO_{IN}$) in response to these voltage signals.

In operation 670, the oscillator circuit 130 regulates a current ($I_{M3}$) based on a voltage difference between the oscillator input signal ($VCO_{IN}$) and the voltage drop ($V_P$). In operation 680, the oscillator circuit 130 generates a current ($I_{M2}$) that is a sum of the currents ($I_{DAC\_RES}$, $I_{M3}$). In operation 690, the oscillator circuit 130 aligns the phase of the oscillator output signal ($OSC_{OUT}$) with the phase of the reference input signal ($REF_{IN}$) based on the current ($I_{M2}$).

In an embodiment, a system comprises an oscillator circuit that includes first and second tuning banks and a current-controlled oscillator. The first tuning bank is connected to a voltage node and receives the tuning signal, generates a voltage drop at the voltage node that corresponds to the tuning signal, and allows the flow of a first current therethrough that varies with the voltage drop. The first tuning bank includes a plurality of switches that selectively connects one or more resistors to the voltage node in response to the tuning signal. The second tuning bank is connected to the voltage node and receives an oscillator input signal and regulates a second current that flows therethrough in response to a voltage difference between the voltage drop and the oscillator input signal. The current-controlled oscillator receives a third current that is a sum of the first and second currents and fine-tunes an oscillator output signal based on the third current to track a frequency of a reference input signal.

In another embodiment, an oscillator circuit comprises a current mirror, first and second tuning banks, and a current-controlled oscillator. The current mirror master and slave transistors. The master transistor generates a first current. The slave transistor generates a second current that mirrors the first current. The first tuning bank is connected to the master transistor at a voltage node and receives a tuning signal, generates a voltage drop at the voltage node that corresponds to the tuning signal, and allows the flow of a third current therethrough that varies with the voltage drop. The second tuning bank is connected to the voltage node and receives an oscillator input signal and regulates a fourth current that flows therethrough in response to a voltage difference between the voltage drop and an oscillator input signal. The current-controlled oscillator is connected to the slave transistor and fine-tunes the oscillator output signal based on the second current to track a frequency of the reference input signal.

In another embodiment, a method for synchronizing an oscillator output signal with a reference input signal comprises: operating a first control loop in a frequency tracking mode; detecting a frequency difference between a reference input signal and an oscillator output signal; generating a tuning signal based on the reference input signal and the detected frequency difference; in response to the tuning signal, selectively connecting one or more resistors to a voltage node to generate a voltage drop at the voltage node and allow the flow of a first current through the one or more resistors that varies with the voltage drop; and fine-tuning the oscillator output signal based on the first current to track a frequency of the reference input signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system comprising:

an oscillator circuit including:

a first tuning bank connected to a voltage node and configured to receive a tuning signal, to generate a voltage drop at the voltage node that corresponds to the tuning signal, and to allow a flow of a first current therethrough that varies with the voltage drop, wherein the first tuning bank includes:

a plurality of switches configured to selectively connect one or more resistors to the voltage node in response to the tuning signal to generate the first current, wherein the first current is a function of the voltage drop and a resistance of the one or more connected resistors;

a second tuning bank connected to the voltage node and configured to receive an oscillator input signal and to regulate a second current that flows therethrough in response to a voltage difference between the voltage drop and the oscillator input signal; and a current-controlled oscillator configured to receive a third current that is a sum of the first and second currents and to fine-tune an oscillator output signal based on the third current to track a frequency of a reference input signal.

2. The system of claim 1, further comprising:

a first control loop configured to receive the reference input signal and the oscillator output signal and to generate the tuning signal that corresponds to a frequency difference between the reference input signal and the oscillator output signal;

a second control loop configured to receive the reference input signal and the oscillator output signal and to generate the oscillator input signal that corresponds to a phase difference between the reference input signal and the oscillator output signal.

3. The system of claim 2, wherein the first control loop includes:

a frequency detector configured to detect the frequency difference between the reference input signal and the oscillator output signal and to generate an error signal proportional to the frequency difference detected thereby;

a filter configured to filter unwanted noise from the error signal; and an oscillator controller configured to receive the reference input signal and the filtered error signal and to generate the tuning signal based on the reference input signal and the filtered error signal.

4. The system of claim 2, wherein the second control loop includes:

a frequency divider configured to divide a frequency of the oscillator output signal by a predetermined factor and to generate a feedback signal having a slower frequency than the oscillator output signal;

a phase detector configured to detect a phase difference between the reference input signal and the feedback signal and to generate an UP signal, which indicates that a phase of the oscillator output signal is lagging a phase of the reference input signal, and a DN signal, which indicates that the phase of the oscillator output signal is leading the phase of the reference input signal; and a charge pump circuit configured to control a voltage level of the oscillator input signal in response to the UP and DN signals.

5. The system of claim 2, wherein:

the system is operable in a frequency tracking mode, where the first control loop is configured to fine-tune the oscillator output signal to track the frequency of the reference input signal, and in a phase tracking mode, where the second control loop adjusts the oscillator output signal to align with a phase of the reference input signal;

during the frequency tracking mode, the second control loop is disabled and the oscillator input signal has a predetermined voltage level; and when the phase tracking mode is enabled, the frequency of the oscillator output signal is locked to the frequency of the reference input signal.

6. The system of claim 5, wherein the first control loop includes:

a frequency detector configured to detect the frequency difference between the reference input signal and the oscillator output signal and to generate an error signal proportional to the frequency difference detected thereby;

a filter configured to filter unwanted noise from the error signal; and an oscillator controller configured to receive the reference input signal and the filtered error signal and to generate a tracking enable signal that is based on the reference input signal and the filtered error signal and that disables or enables the second control loop.

7. The system of claim 1, wherein the current-controlled oscillator includes a multi-phase oscillator configured to receive an oscillator output signal and to generate a plurality of oscillator output signals, each phased-shifted by a predetermined phase angle, based on the oscillator output signal received thereby.

8. The system of claim 7, further comprising a multi-phase alternating current (AC) buffer circuit configured to receive the oscillator output signals and to split the oscillator output signals received thereby into one or more paths.

9. The system of claim 8, further comprising a frequency multiplier configured to receive the oscillator output signal and to generate an oscillator output signal having a frequency a multiple of a frequency of the oscillator output signal received thereby.

10. The system of claim 9, further comprising a multiplexer having a plurality of input terminals each connected to a respective current-controlled oscillator and the frequency multiplier and configured to selectively connect one of the input terminals thereof to an output terminal thereof in response to a select signal.

11. An oscillator circuit comprising:

a current mirror including:

a master transistor configured to generate a first current; and a slave transistor configured to generate a second current that mirrors the first current;

a first tuning bank connected to the master transistor at a voltage node and configured to receive a tuning signal, to generate a voltage drop at the voltage node that corresponds to the tuning signal, and to allow a flow of a third current therethrough that varies with the voltage drop, wherein the first tuning bank includes a plurality of resistors, the first tuning bank is configured to generate the third current by selectively connecting one or more resistors to the voltage node in response to the tuning signal, and the third current is a function of the voltage drop and a resistance of the one or more connected resistors;

a second tuning bank connected to the voltage node and configured to receive an oscillator input signal and to regulate a fourth current that flows therethrough in response to a voltage difference between the voltage drop and an oscillator input signal; and a current-controlled oscillator connected to the slave transistor and configured to fine-tune an oscillator output signal based on the second current to track a frequency of the reference input signal.

12. The oscillator circuit of claim 11, wherein the second tuning bank includes a transistor having:

a source/drain terminal connected to the voltage node; and a gate terminal configured to receive the oscillator input signal.

13. The oscillator circuit of claim 11, wherein the current-controlled oscillator includes a multi-phase oscillator configured to receive the oscillator output signal and to generate a plurality of oscillator output signals, each phase-shifted by a predetermined phase angle, based on the oscillator output signal received thereby.

14. The oscillator circuit of claim 11, further comprising a frequency multiplier configured to receive the oscillator output signal and to generate an oscillator output signal having a frequency a multiple of a frequency of the oscillator output signal received thereby.

15. A method for synchronizing an oscillator output signal with a reference input signal, the method comprising:

operating a first control loop in a frequency tracking mode;

detecting a frequency difference between a reference input signal and an oscillator output signal;

generating a tuning signal based on the reference input signal and the detected frequency difference;

in response to the tuning signal, selectively connecting one or more resistors to a voltage node to generate a voltage drop at the voltage node and allow a flow of a first current through the one or more resistors that varies with the voltage drop, wherein the first current is a function of the voltage drop and a resistance of the one or more connected resistors; and fine-tuning the oscillator output signal based on the first current to track a frequency of the reference input signal.

16. The method of claim 15, further comprising:

generating an oscillator input signal having a predetermined voltage level;

receiving the oscillator input signal;

generating a second current based on the voltage drop and the oscillator input signal; and fine-tuning the oscillator output signal based on a sum of the first and second currents to track the frequency of the reference input signal.

17. The method of claim 16, further comprising:

locking a frequency of the oscillator output signal to the frequency of the reference input signal;

operating in a phase tracking mode;

enabling a second analog control loop;

dividing a frequency of oscillator output signal by a predetermined factor to generate a feedback signal having a slower frequency than the frequency of the oscillator output signal;

detecting a phase difference between the reference input signal and the feedback signal to generate an UP signal, which indicates that a phase of the oscillator output signal is lagging a phase of the of the reference input signal, and a DN signal, which indicates that the phase of the oscillator output signal is leading the phase of the of the reference input signal;

controlling a voltage level of the oscillator input signal in response to the UP and DN signals;

receiving the oscillator input signal;

generating the second current based on the voltage drop and the oscillator input signal; and in response to a sum of the first and second currents, aligning a phase of the oscillator output signal with a phase of the reference input signal.

18. The method of claim 15, further comprising:

receiving the oscillator output signal; and generating a plurality of oscillator output signals, each phase-shifted by a predetermined phase angle, based on the received oscillator output signal.

19. The method of claim 15, further comprising:

receiving the oscillator output signal; and generating an oscillator output signal having a frequency a multiple of a frequency of the received oscillator output signal.

20. The system of claim 1, wherein the first current reaches a maximum value at a slow-slow corner of the system and a minimum value at a fast-fast corner of the system.

* * * * *